United States Patent
Takada

(10) Patent No.: US 7,853,836 B2
(45) Date of Patent: Dec. 14, 2010

(54) SEMICONDUCTOR INTEGRATED CIRCUIT

(75) Inventor: Shuichi Takada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 12/047,753

(22) Filed: Mar. 13, 2008

(65) Prior Publication Data

US 2008/0224722 A1    Sep. 18, 2008

(30) Foreign Application Priority Data

Mar. 14, 2007   (JP)   ............... 2007-065518

(51) Int. Cl.
  *G11B 20/20* (2006.01)
  *G01R 31/28* (2006.01)
(52) U.S. Cl. ...................... 714/700; 714/744
(58) Field of Classification Search .......... 714/700, 714/744
See application file for complete search history.

(56) References Cited

U.S. PATENT DOCUMENTS

| | | | | |
|---|---|---|---|---|
| 5,793,822 | A * | 8/1998 | Anderson et al. | 375/371 |
| 7,142,623 | B2 | 11/2006 | Sorna | |
| 7,558,991 | B2 * | 7/2009 | Mattes et al. | 714/700 |
| 2007/0113119 | A1 * | 5/2007 | Hafed et al. | 714/700 |
| 2009/0086801 | A1 * | 4/2009 | Liu et al. | 375/224 |

FOREIGN PATENT DOCUMENTS

JP    2006-025114    1/2006

* cited by examiner

*Primary Examiner*—James C Kerveros
(74) *Attorney, Agent, or Firm*—Turocy & Watson, LLP

(57) ABSTRACT

A semiconductor integrated circuit includes a clock generator which generates a first clock, a test data generator which modulates a phase of the first clock, and generates test data to which jitter is added by using the modulated clock, a data extractor which samples the test data and extracts recovery data, and a detector which detects an error of the recovery data.

15 Claims, 6 Drawing Sheets

SEMICONDUCTOR INTEGRATED CIRCUIT

CROSS-REFERENCE TO RELATED APPLICATIONS

This application is based upon and claims the benefit of priority from prior Japanese Patent Application No. 2007-065518, filed Mar. 14, 2007, the entire contents of which are incorporated herein by reference.

BACKGROUND OF THE INVENTION

1. Field of the Invention

The present invention relates to a semiconductor integrated circuit including a data extractor for extracting recovery data from external input data and, more particularly, to a semiconductor integrated circuit including a test circuit for testing the data extractor.

2. Description of the Related Art

When transferring high-speed data exceeding 1 Gbit/sec, "the characteristics of transmitting and receiving circuits or the characteristics of transmission lines including connecting tools connected to transmitting and receiving terminals" cause delay or reflection of pulses, or mutual interference between signal pulses and reflected pulses. Even when the transmitting side simultaneously transmits transmission data and a transmission clock, therefore, a difference (skew) is produced between the times of arrival of reception data and a reception clock on the receiving side. This makes it difficult to discriminate the contents of the reception data on the receiving side.

Accordingly, in high-speed serial transfer that transfers serial data at a high speed, for example, a receiving-side apparatus that receives serial data uses a clock and data recovery (CDR) circuit. The CDR circuit detects the phase of the input serial data, and generates a recovery clock phase-locked with the serial data. The CDR circuit then outputs retiming data obtained by sampling the serial data in synchronism with this recovery clock.

Conventionally, the jitter resistance of the CDR circuit incorporated into a large-scale integrated circuit (LSI) is measured as follows. A receiver receives a modulated signal obtained by modulating, by a modulator, a high-frequency, pseudo-random bit sequence (PRBS) signal generated by an external PRBS generator, and the CDR circuit extracts recovery data from the modulated signal. A PRBS detector checks matching of the extracted recovery data. If the recovery data does not match, the PRBS detector outputs an error flag. The external PRBS generator and the internal PRBS detector of the LSI are preset to have the same code sequence.

To measure the jitter resistance by generating data exceeding the GHz band outside an LSI, however, expensive apparatuses are necessary, and a new installation cost is required in mass-production.

A communication apparatus capable of testing the jitter resistance of a receiver is disclosed as a related technique of this kind (Jpn. Pat. Appln. KOKAI Publication No. 2006-25114).

BRIEF SUMMARY OF THE INVENTION

According to a first aspect of the present invention, there is provided a semiconductor integrated circuit comprising: a clock generator which generates a first clock; a test data generator which modulates a phase of the first clock, and generates test data to which jitter is added by using the modulated clock; a data extractor which samples the test data and extracts recovery data; and a detector which detects an error of the recovery data.

According to a second aspect of the present invention, there is provided a semiconductor integrated circuit comprising: a clock generator which generates a first clock; a test data generator which modulates a phase of the first clock, and generates test data to which jitter is added by using the modulated clock; a data extractor which samples the test data and extracts recovery data; and a detector which detects an error of the recovery data. The test data generator includes: a phase interpolator which generates a second clock by modulating the phase of the first clock; and a generator which generates the test data by adding jitter to a bit sequence by using the second clock.

According to a third aspect of the present invention, there is provided a semiconductor integrated circuit comprising: a clock generator which generates a first clock; a test data generator which modulates a phase of the first clock, and generates test data to which jitter is added by using the modulated clock; a data extractor which samples the test data and extracts recovery data; and a detector which detects an error of the recovery data. The data extractor includes: a phase interpolator which generates a recovery clock by modulating the phase of the first clock; and a sampling circuit which samples the test data on edges of the recovery clock.

DETAILED DESCRIPTION OF THE INVENTION

Figure 1:
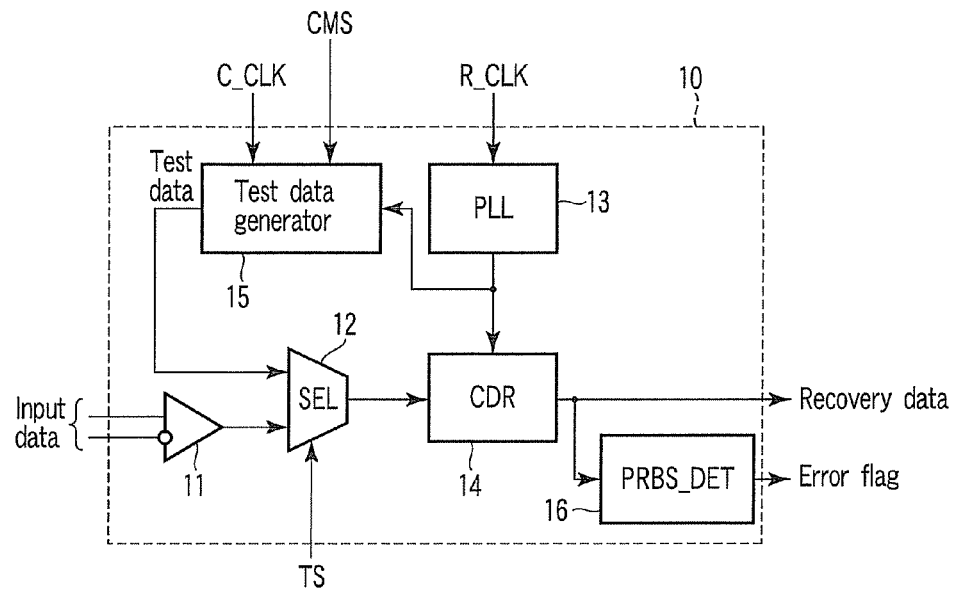
FIG. 1 is a block diagram illustrating the arrangement of an LSI 10 according to an embodiment of the present invention.

An embodiment of the present invention will be explained below with reference to the accompanying drawing. Note that in the following explanation, the same reference numerals denote elements having the same functions and arrangements, and a repetitive explanation will be made only when necessary.

FIG. 1 is a block diagram illustrating the arrangement of a semiconductor integrated circuit (LSI) 10 according to the embodiment of the present invention. The LSI 10 comprises a receiver 11, selector (SEL) 12, phase locked loop (PLL) circuit 13, data extractor (CDR circuit) 14, test data generator 15, and PRBS data detector (PRBS_DET) 16. The LSI 10 is fabricated as a chip in which these circuits are mounted on the same substrate.

A reference clock R_CLK is input to the PLL circuit (clock generator) 13. The frequency of the reference clock R_CLK is set to an integral fraction of the reception data rate. The reference clock R_CLK can be input from an external circuit to the PLL circuit 13, or from an oscillator included in the LSI 10 to the PLL circuit 13.

The PLL circuit 13 generates internal clocks (ICK, QCK, ICKB, and QCKB to be described later) from the reference clock R_CLK. These internal clocks are set at a frequency that is an integral multiple of the frequency of the reference clock R_CLK. This frequency is the same as the reception data rate. For example, when the reception data rate is 1 Gbit/s, the output frequency from the PLL circuit 13 is 1 GHz. The PLL circuit 13 makes it possible to generate the internal clocks having stable phases.

The test data generator 15 generates test data to which jitter (phase noise) is added, by using the internal clocks generated by the PLL circuit 13. More specifically, the test data generator 15 generates pseudo-random bit sequence (PRBS) data, and generates test data by adding jitter to this PRBS data. The test data generator 15 is also capable of freely changing the amplitude and frequency of jitter to be added to the PRBS data. A practical arrangement of the test data generator 15 will be described later. The test data generated by the test data generator 15 is input to the first input terminal of the selector 12.

The selector 12 receives, at the second input terminal, input data that is a differential signal input from the external circuit to the LSI 10 via the receiver 11. The selector 12 selects one of the test data input to the first input terminal, and the input data input to the second input terminal. A test selection signal TS input from the external circuit controls this selecting operation. More specifically, on the basis of the test selection signal TS, the selector 12 selects the test data when conducting a jitter resistance test on the CDR circuit 14, or the input data in a normal operation except for the test.

The CDR circuit 14 detects the phase of the input data (or test data) input from the selector 12, and generates a recovery clock phase-locked with the input data. In addition, the CDR circuit 14 outputs, as recovery data, retiming data obtained by sampling the input data in synchronism with the phase of the recovery clock.

The output recovery data from the CDR circuit 14 is output to the external circuit, and input to the PRBS data detector (PRBS_DET) 16. During the test, the PRBS data detector 16 detects whether the recovery data matches the PRBS data generated by the test data generator 15. "A PRBS data generator 55 included in the test data generator 15" and the PRBS data detector 16 are preset to have the same code sequence. If the data comparison result indicates that the two data do not match, the PRBS data detector 16 outputs an error flag to the external circuit.

Figure 2:
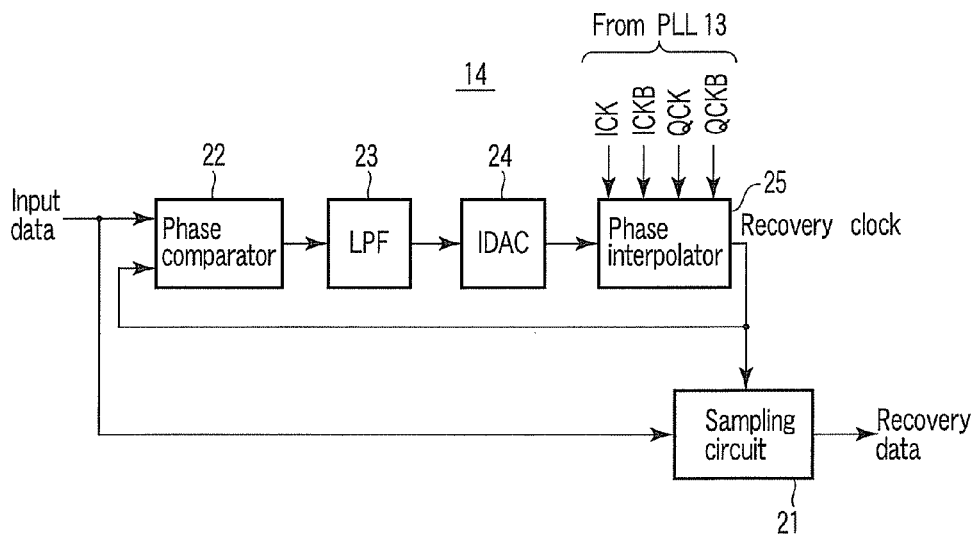
FIG. 2 is a block diagram illustrating an example of a CDR circuit 14 shown in FIG. 1.

FIG. 2 is a block diagram illustrating an example of the CDR circuit 14. The CDR circuit 14 comprises a sampling circuit 21, phase comparator 22, loop filter (low-pass filter [LPF]) 23, current output digital-to-analog converter (IDAC) 24, and phase interpolator 25.

The phase comparator 22 compares the phase of the input data with that of the recovery clock supplied from the phase interpolator 25. The phase comparator 22 outputs an UP signal if the phase of the recovery clock lags behind that of the input data, and a DOWN signal if the phase of the recovery clock leads that of the input data.

The LPF 23 removes (integrates) the high-frequency component from a pulse-like phase difference signal output from the phase comparator 22, and inputs the signal to the IDAC 24. The IDAC 24 converts the phase difference signal input from the LPF 23 into a current value.

The phase interpolator 25 receives the internal clocks ICK, ICKB, QCK, and QCKB from the PLL circuit 13, in addition to the current value from the IDAC 24. The phase interpolator 25 adjusts the phases of the internal clocks by using the phase difference signal from the IDAC 24, thereby generating a recovery clock phased with the input data. This recovery clock is fed back to the phase comparator 22, and input to the sampling circuit 21.

The input data is input to the sampling circuit 21. The sampling circuit 21 samples and holds the input data on the leading edge of the recovery clock. Finally, the sampling circuit 21 outputs, as recovery data, retiming data sampled on the leading edge of the recovery clock phased with the input data.

Figure 3:
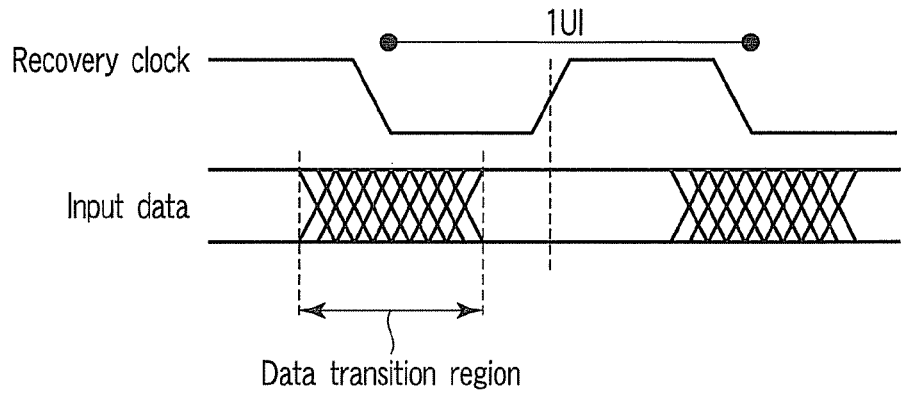
FIG. 3 is a view illustrating the timing at which a sampling circuit 21 samples input data.

FIG. 3 is a view illustrating the timing at which the sampling circuit 21 samples the input data. UI shown in FIG. 3 indicates a minimum width (unit interval) of data. The sampling circuit 21 performs sampling intermediate between input data transition regions. Therefore, if the leading edge of the recovery clock output from the phase interpolator 25 exists in the input data transition region, the phase comparator 22 outputs a phase difference signal for adjusting the phase amount of the recovery clock.

This phase difference signal is input to the phase interpolator 25 via the LPF 23 for removing the high-frequency component and the IDAC 24 for adjusting the current value. The phase interpolator 25 adjusts the phases of the internal clocks from the PLL circuit 13 in accordance with the controlled current value from the IDAC 24. Finally, this feedback control allows the sampling circuit 21 to sample the phase relationship between the input data and recovery clock intermediate between the data transition regions.

Figure 4:
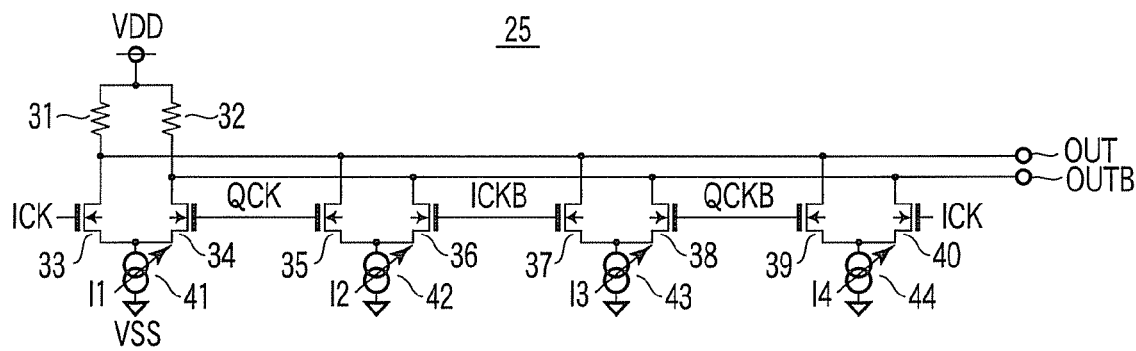
FIG. 4 is a circuit diagram illustrating an example of a phase interpolator 25 shown in FIG. 2.
Figure 5:
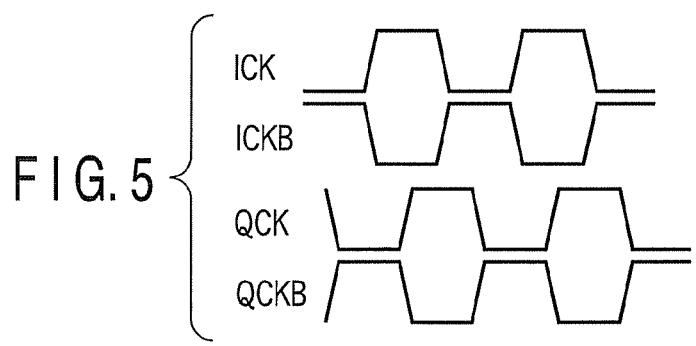
FIG. 5 is a timing chart illustrating internal clocks supplied from a PLL circuit 13 to the phase interpolator 25.

FIG. 4 is a circuit diagram illustrating an example of the phase interpolator 25 shown in FIG. 2. FIG. 5 is a timing chart illustrating the internal clocks ICK, QCK, ICKB, and QCKB supplied from the PLL circuit 13 to the phase interpolator 25. The phases of the internal clocks ICK, QCK, ICKB, and QCKB are shifted 90° from each other in the order named.

The phase interpolator 25 comprises four differential amplifiers. The phase interpolator 25 includes two resistors 31 and 32, eight N-channel MOS (NMOS) transistors 33 to 40, and four variable current sources 41 to 44.

More specifically, one terminal of the resistor 31 is connected to a power supply terminal to which a power supply voltage VDD is supplied. The other terminal of the resistor 31 is connected to the drains of the NMOS transistors 33, 35, 37, and 39. One terminal of the resistor 32 is connected to the power supply terminal to which the power supply voltage VDD is supplied. The other terminal of the resistor 32 is connected to the drains of the NMOS transistors 34, 36, 38, and 40.

The internal clock ICK is supplied to the gates of the NMOS transistors 33 and 40. The internal clock QCK is supplied to the gates of the NMOS transistors 34 and 35. The internal clock ICKB is supplied to the gates of the NMOS transistors 36 and 37. The internal clock QCKB is supplied to the gates of the NMOS transistors 38 and 39.

The sources of the NMOS transistors 33 and 34 are grounded (connected to a ground voltage VSS) via the variable current source 41. The sources of the NMOS transistors 35 and 36 are grounded via the variable current source 42. The sources of the NMOS transistors 37 and 38 are grounded via the variable current source 43. The sources of the NMOS transistors 39 and 40 are grounded via the variable current source 44.

The IDAC 24 supplies a current I1 to the control terminal of the variable current source 41. The IDAC 24 supplies a current I2 to the control terminal of the variable current source 42. The IDAC 24 supplies a current I3 to the control terminal of the variable current source 43. The IDAC 24 supplies a current I4 to the control terminal of the variable current source 44.

In the phase interpolator 25 configured as above, the four-phase clocks (ICK, QCK, ICKB, and QCKB) supplied form the PLL circuit 13 are input to the four differential amplifiers to adjust weighting of each of the variable current sources 41 to 44. Thus, the phase interpolator 25 can adjust the phase of the recovery clock from 0 to 360°.

Figure 6:
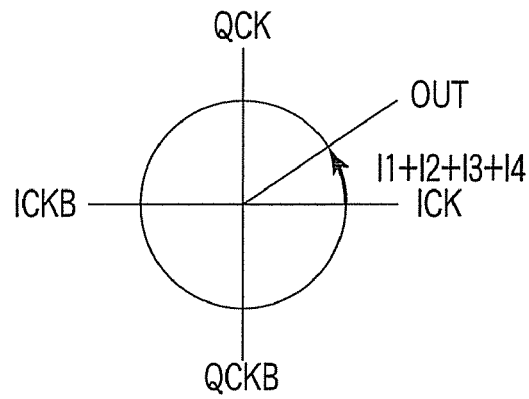
FIG. 6 is a view illustrating recovery clock phase modulation performed by the phase interpolator 25.

FIG. 6 is a view illustrating recovery clock phase modulation performed by the phase interpolator 25. For example, in clock generation in the first quadrant of FIG. 6, only I1 is adjusted by setting I2=I3=I4=0. In clock generation in the second quadrant of FIG. 6, only I2 is adjusted by setting I1=I3=I4=0. In clock generation in the third quadrant of FIG. 6, only I3 is adjusted by setting I1=I2=I4=0. In clock generation in the fourth quadrant of FIG. 6, only I4 is adjusted by setting I1=I2=I3=0. In this way, with respect to the four-phase clocks (ICK, QCK, ICKB, and QCKB) having phases shifted 90° from each other, the phase of an output OUT changes in accordance with the magnitudes of the currents I1 to I4 supplied from the IDAC 24. Finally, the phase-adjusted recovery clock is output from an output terminal OUT connected to the other terminal of the resistor 31, and from an output terminal OUTB connected to the other terminal of the resistor 32.

Figure 7:
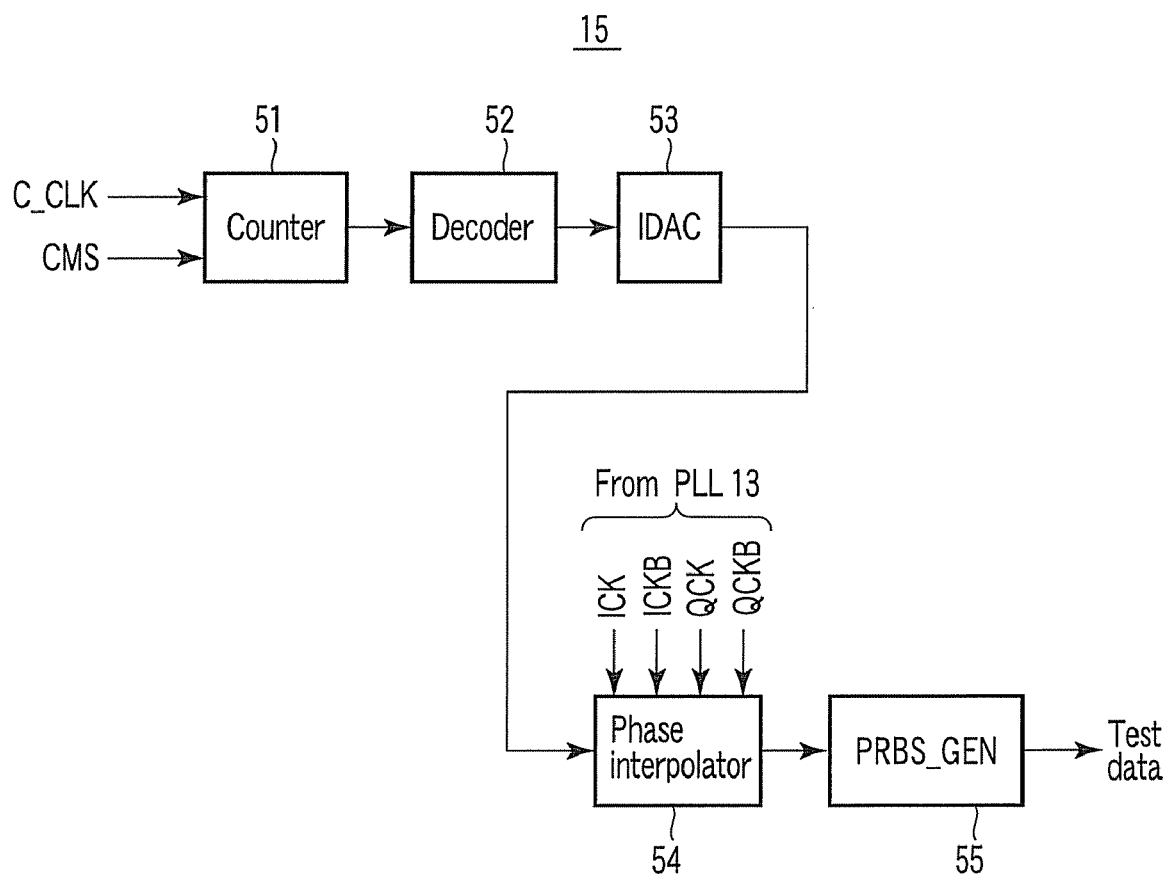
FIG. 7 is a block diagram illustrating an example of a test data generator 15 shown in FIG. 1.

Next, an example of the test data generator 15 will be explained below. FIG. 7 is a block diagram illustrating the arrangement of the test data generator 15 shown in FIG. 1. The test data generator 15 comprises a counter 51, decoder 52, IDAC 53, phase interpolator 54, and PRBS data generator (PRBS_GEN) 55. The IDAC 53 and phase interpolator 54 respectively have the same arrangements as those of the IDAC 24 and phase interpolator 25 shown in FIG. 2.

The counter 51 receives a counter clock C_CLK and counter mode switching signal CMS from the external circuit. The counter 51 counts pulses of the counter clock C_CLK. The counter mode switching signal CMS switches the operation modes (count-up and count-down) of the counter 51. That is, the counter 51 repeats up-count or down-count of a predetermined amount on the basis of the counter mode switching signal CMS.

The decoder 52 decodes the count of the counter 51, and converts the decoded count into a weighting amount to be used in the IDAC 53 on the output stage. The IDAC 53 supplies a current magnitude to the phase interpolator 54. The phase interpolator 54 generates a modulated clock by performing phase modulation and frequency modulation on the four-phase clocks (ICK, QCK, ICKB, and QCKB) from the PLL circuit 13. This modulated clock is supplied to the PRBS data generator 55. The PRBS data generator 55 generates test data by adding jitter to the PRBS data by using the modulated clock.

In the test data generator 15 configured as above, the modulation amount of the modulated clock can be adjusted by changing the amount of switching from up-count to down-count by using the signal CMS for switching the operation modes of the counter 51. Finally, the phase and frequency of the test data output from the test data generator 15 can be modulated in synchronism with the counter clock C_CLK.

Examples of the modulated clock generated by the phase interpolator 54 will be explained below. Assume that the phase adjustment amount of the phase interpolator 54 is divided by 64, and the count of the counter 51 ranges from 0 to 63.

Figure 8:
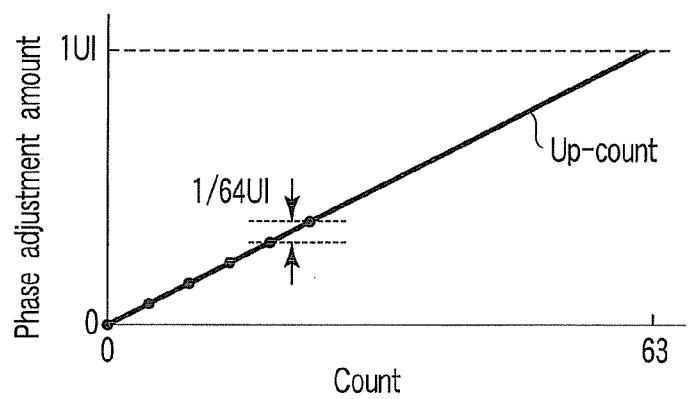
FIG. 8 is a graph illustrating the first example of a modulation clock generated by a phase interpolator 54.
Figure 9:
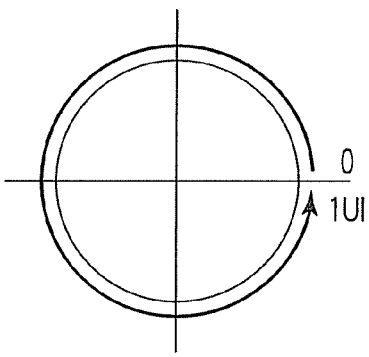
FIG. 9 is a view illustrating a phase change of the modulation clock in the first example.

FIG. 8 shows the first example of the modulated clock generated by the phase interpolator 54. That is, FIG. 8 is a graph illustrating the modulated clock when the phase adjustment amount is 1 UI. FIG. 9 is a view illustrating a phase change of the modulated clock in the first example. Referring to FIG. 8, the ordinate indicates the phase modulation amount of the modulated clock, and the abscissa indicates the count of the counter 51.

In the first example, the count increases for every cycle of the counter clock C_CLK, so the phase adjustment amount of the modulated clock generated by the phase interpolator 54 is 1 UI. Accordingly, the phase interpolator 54 can change the phase of the modulated clock through 360°. Note that the time (frequency) required for the change of 1 UI can be changed by changing the frequency of the counter clock C_CLK.

Figure 10:
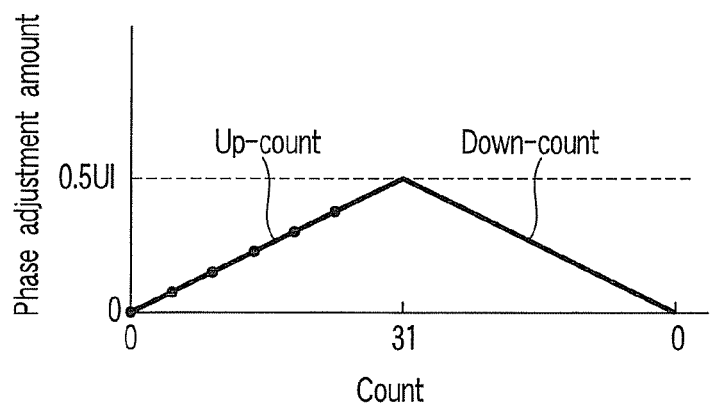
FIG. 10 is a graph illustrating the second example of the modulation clock generated by the phase interpolator 54.
Figure 11:
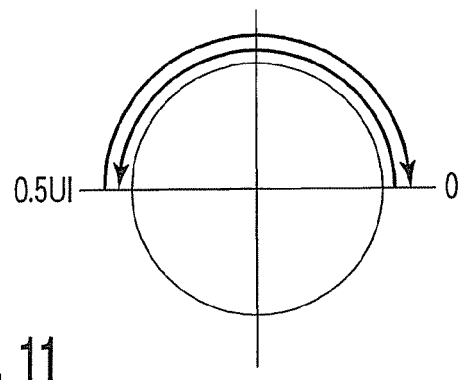
FIG. 11 is a view illustrating a phase change of the modulation clock in the second example.

FIG. 10 shows the second example of the modulated clock. That is, FIG. 10 is a graph illustrating the modulated clock when the phase adjustment amount is 0.5 UI. FIG. 11 is a view illustrating a phase change of the modulated clock in the second example.

In the second example, the increase/decrease amount of the counter value is set such that the count repetitively increases or decreases from 0 to 31. Since the count increases for every cycle of the counter clock C_CLK, the phase adjustment amount of the modulated clock generated by the phase interpolator 54 is 0.5 UI. The time (frequency) required for the change of 0.5 UI can be changed by changing the frequency of the counter clock C_CLK.

Figure 12:
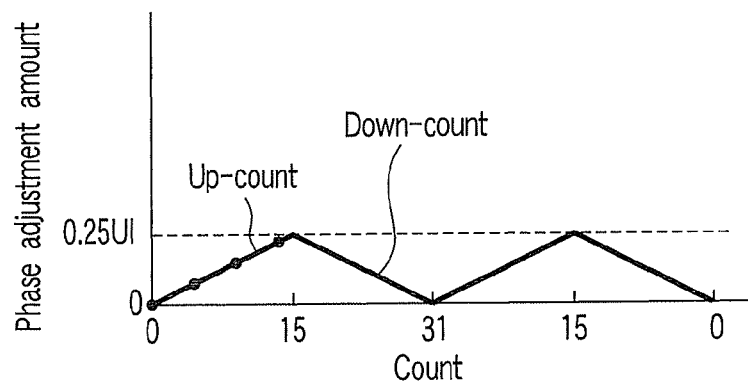
FIG. 12 is a graph illustrating the third example of the modulation clock generated by the phase interpolator 54.
Figure 13:
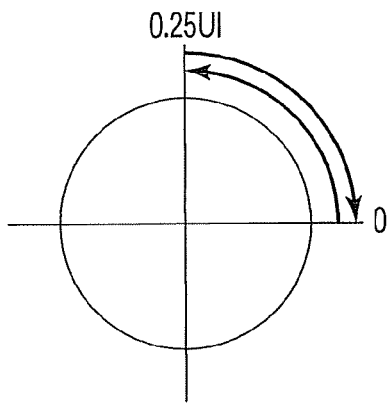
FIG. 13 is a view illustrating a phase change of the modulation clock in the third example.

FIG. 12 shows the third example of the modulated clock. That is, FIG. 12 is a graph illustrating the modulated clock when the phase adjustment amount is 0.25 UI. FIG. 13 is a view illustrating a phase change of the modulated clock in the third example.

In the third example, the increase/decrease amount of the counter value is set such that the count repetitively increases or decreases from 0 to 15. Since the count increases for every cycle of the counter clock C_CLK, the phase adjustment amount of the modulated clock generated by the phase interpolator 54 is 0.25 UI. The time (frequency) required for the change of 0.25 UI can be changed by changing the frequency of the counter clock C_CLK.

Figure 14:
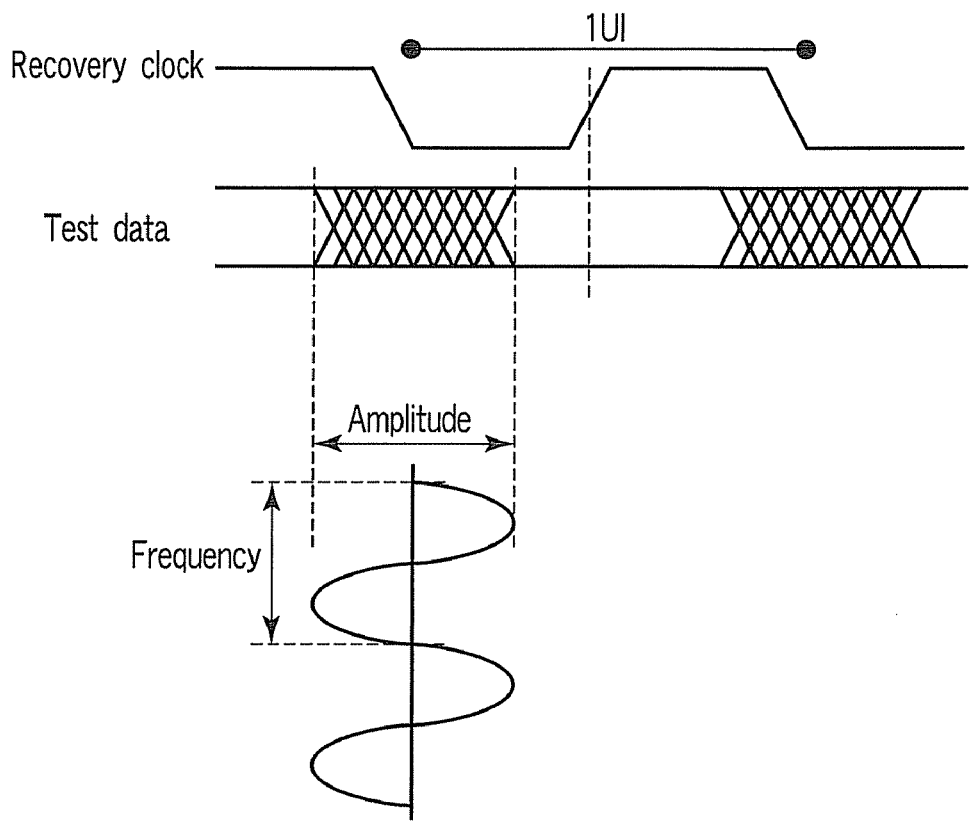
FIG. 14 is a view illustrating an eye pattern indicating the movement of test data generated by the test data generator 15.

FIG. 14 is an eye pattern illustrating the movement of the test data generated by the test data generator 15. The use of the test data generator 15 shown in FIG. 7 makes it possible to freely control the intensity (amplitude) and frequency of the jitter of the test data.

Figure 15:
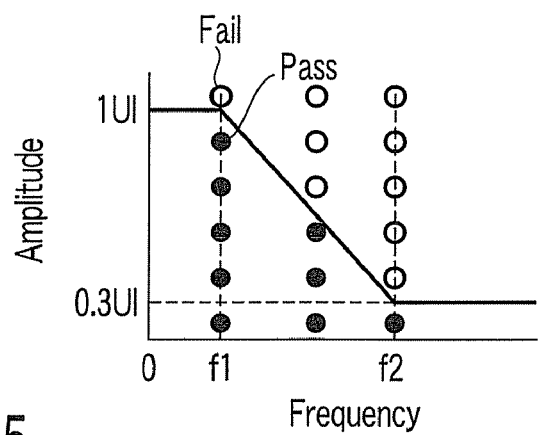
FIG. 15 is a graph for evaluating the jitter resistance of the LSI 10.

FIG. 15 is a graph for evaluating the jitter resistance of the LSI 10. Referring to FIG. 15, the ordinate indicates the jitter amplitude, and the abscissa indicates the jitter frequency.

As described above, the intensity (amplitude) and frequency of the jitter of the test data can be freely controlled by using the test data generator 15 of this embodiment. Since this makes it possible to add a desired jitter to the test data without using any measurement apparatus, the jitter resistance can be accurately evaluated.

That is, as shown in FIG. 15, the jitter resistance of the LSI 10 can be evaluated by using a matrix. Therefore, a chip satisfying the specifications of the jitter resistance can be accurately and easily selected. For example, the boundary between hollow circles (fail) and solid circles (pass) becomes clear in the jitter matrix shown in FIG. 15. This allows accurate selection of a chip capable of recovering data against jitter.

In this embodiment as has been described in detail above, test data having a desired jitter can be generated inside the LSI 10. This makes it possible to conduct a jitter resistance test on the LSI 10 (more specifically, the CDR circuit 14) without using any expensive test apparatus. Consequently, defects in the mass-production process of the LSI 10 can be detected in advance.

It is also possible, by using the internal clocks generated by the PLL circuit 13, to generate test data containing jitter and not synchronized with the internal clocks. This embodiment can also freely change the intensity and frequency of the jitter. Accordingly, the jitter resistance test can be accurately conducted.

Furthermore, circuit design is facilitated because the IDAC and phase interpolator identical to those used in the CDR circuit 14 can also be used in the test data generator 15.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a clock generator which generates a first clock;
   a counter which receives a second clock, and counts up or down the second clock on the basis of a switching signal;
   a decoder which decodes a count of the counter;
   a first phrase interpolator which modulates the first clock on the basis of an output from the decoder to generate a third clock;
   a data generator which generates test data by adding jitter to a bit sequence on the basis of the third clock;
   a data extractor which samples the test data and extracts recovery data; and
   a detector which detects an error of the recovery data,
   wherein the first phase interpolator changes an amplitude and frequency of the jitter by changing a phase and frequency of the first clock.

2. The circuit according to claim 1, wherein the clock generator generates the first clock by receiving a reference clock, and multiplying a frequency of the reference clock by an integer.

3. The circuit according to claim 1, further comprising:
   a receiver which receives input data; and
   a selector which receives the input data and the test data, and selects one of the input data and the test data, wherein the data extractor extracts the recovery data from one of the input data and the test data selected by the selector.

4. The circuit according to claim 3, wherein the selector receives a selection signal, and selects one of the input data and the test data on the basis of the selection signal.

5. The circuit according to claim 1, wherein the frequency of the jitter changes in accordance with a frequency of the second clock.

6. The circuit according to claim 1, wherein the amplitude of the jitter changes in accordance with the count.

7. The circuit according to claim 1, wherein the first clock comprises a plurality of first clocks having phase differences at equal intervals, and
   the first phase interpolator generates the third clock by using the first clocks.

8. The circuit according to claim 7, wherein the first clocks comprise four clocks having phases shifted 90 degrees from each other.

9. The circuit according to claim 1, wherein the first phase interpolator includes a differential amplifier.

10. The circuit according to claim 1, wherein the detector compares the recovery data with the bit sequence, and detects whether the recovery data matches the bit sequence.

11. The circuit according to claim 1, wherein the data extractor includes:
    a second phase interpolator which generates a recovery clock by modulating the phase of the first clock; and
    a sampling circuit which samples the test data on edges of the recovery clock.

12. The circuit according to claim 11, wherein
    the data extractor includes a comparator which compares a phase of the test data with that of the recovery clock, and
    the second phase interpolator modulates the phase of the first clock by using a phase difference signal from the comparator.

13. The circuit according to claim 11, wherein
    the first clock comprises a plurality of first clocks having phase differences at equal intervals, and
    the second phase interpolator generates the recovery clock by using the first clocks.

14. The circuit according to claim 13, wherein the first clocks comprise four clocks having phases shifted 90 degrees from each other.

15. The circuit according to claim 11, wherein the second phase interpolator includes a differential amplifier.

* * * * *